(12) United States Patent
Visokay et al.

(10) Patent No.: US 8,273,645 B2
(45) Date of Patent: Sep. 25, 2012

(54) METHOD TO ATTAIN LOW DEFECTIVITY FULLY SILICIDED GATES

(75) Inventors: Mark Robert Visokay, Wappingers Falls, NY (US); Freidoon Mehrad, Plano, TX (US); Richard L. Guldi, Dallas, TX (US); Yaw Samuel Obeng, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/537,336

(22) Filed: Aug. 7, 2009

(65) Prior Publication Data
US 2011/0097884 A1  Apr. 28, 2011

Related U.S. Application Data

(60) Provisional application No. 61/086,944, filed on Aug. 7, 2008.

(51) Int. Cl.
*H01L 21/3205* (2006.01)
*H01L 21/4763* (2006.01)

(52) U.S. Cl. .................................. 438/586; 438/592

(58) Field of Classification Search ................... None
See application file for complete search history.

(56) References Cited

U.S. PATENT DOCUMENTS

| 6,084,280 | A | * | 7/2000 | Gardner et al. | 257/412 |
|---|---|---|---|---|---|
| 2005/0272235 | A1 | * | 12/2005 | Wu et al. | 438/592 |
| 2006/0084247 | A1 | * | 4/2006 | Liu | 438/510 |
| 2006/0172492 | A1 | * | 8/2006 | Froment et al. | 438/257 |
| 2007/0026600 | A1 | * | 2/2007 | Komori | 438/199 |
| 2008/0224232 | A1 | * | 9/2008 | Hsieh et al. | 257/384 |

* cited by examiner

*Primary Examiner* — Julio J Maldonado
*Assistant Examiner* — Shantanu C Pathak
(74) *Attorney, Agent, or Firm* — Jacqueline J. Garner; Wade J. Brady, III; Frederick J. Telecky, Jr.

(57) ABSTRACT

A method of forming fully silicided (FUSI) gates in MOS transistors which is compatible with wet etch processes used in source/drain silicide formation is disclosed. The gate silicide formation step produces a top layer of metal rich silicide which is resistant to removal in wet etch processes. A blocking layer over active areas prevents source/drain silicide formation during gate silicide formation. Wet etches during removal of the blocking layer and source/drain metal strip do not remove the metal rich gate silicide layer. Anneal of the gate silicide to produce a FUSI gate with a desired stoichiometry is delayed until after formation of the source/drain silicide. The disclosed method is compatible with nickel and nickel-platinum silicide processes.

19 Claims, 15 Drawing Sheets

US 8,273,645 B2

METHOD TO ATTAIN LOW DEFECTIVITY FULLY SILICIDED GATES

FIELD OF THE INVENTION

This invention relates to the field of integrated circuits. More particularly, this invention relates to methods to improve fully silicided MOS transistor gates in integrated circuits.

BACKGROUND OF THE INVENTION

Metal oxide semiconductor (MOS) transistors in integrated circuits (ICs) sometimes have fully silicided (FUSI) gates to reduce the depletion region in the gate, commonly known as poly depletion. Gate silicidation to form FUSI gates is commonly performed prior to source/drain silicidation, to separately optimize the gate silicide and source/drain silicide processes. Forming FUSI gates in this manner can be problematic, due to sensitivity of the gate silicide to various wet process steps in the source/drain silicidation process sequence, which can undesirably etch the gate silicide, causing defective MOS transistors.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a method of forming FUSI gates in an metal oxide semiconductor (MOS) transistor in integrated circuits (ICs) in which a metal rich phase of silicide, which is resistant to subsequent wet etch operations, is formed on a top surface of a gate of the MOS transistor, followed by formation of source/drain silicide regions, followed in turn by a silicide anneal process sequence which converts both the gate silicide and source/drain silicide to their desired stoichiometries.

An advantage of the instant invention is FUSI gates may be integrated into MOS IC fabrication sequences with high yield and minimum added fabrication cost or complexity.

DETAILED DESCRIPTION

Figure 1A:
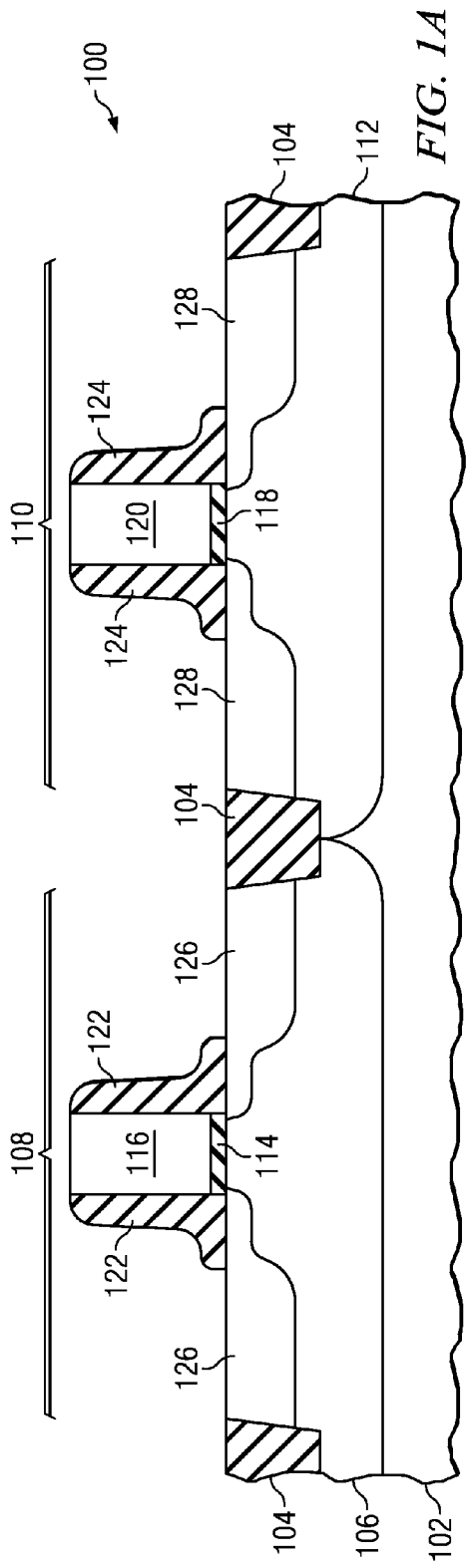
FIG. 1A through FIG. 1P are cross-sections of an IC containing an n-channel MOS (NMOS) transistor and a p-channel MOS (PMOS) transistor with FUSI gates formed according to the instant invention in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The problem of fully silicided (FUSI) gate silicide sensitivity to wet etch operations in a source/drain silicidation process sequence is addressed by the instant invention, which provides a method of forming FUSI gates in a metal oxide semiconductor (MOS) transistor in integrated circuits (ICs) in which a metal rich phase of silicide, which is resistant to subsequent wet operations, is formed on a top surface of a gate of the MOS transistor, followed by formation of source/drain silicide regions, followed in turn by a silicide anneal process sequence which converts both the gate silicide and source/drain silicide to their desired stoichiometries.

Figure 1B:
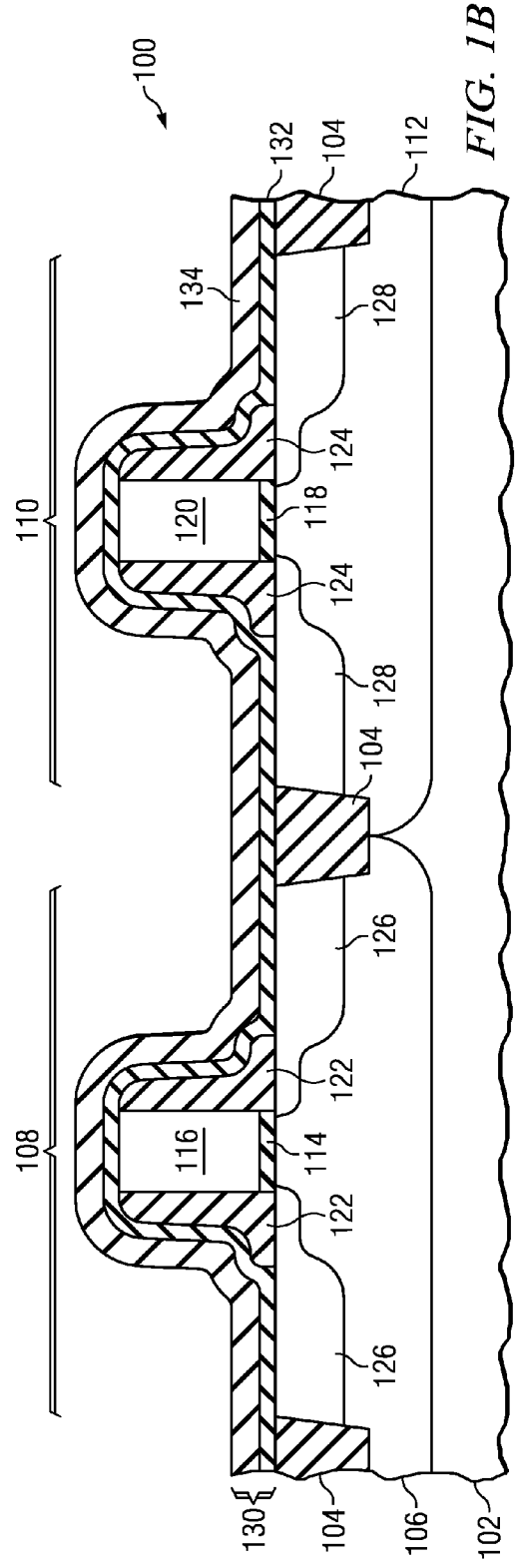
Figure 1C:
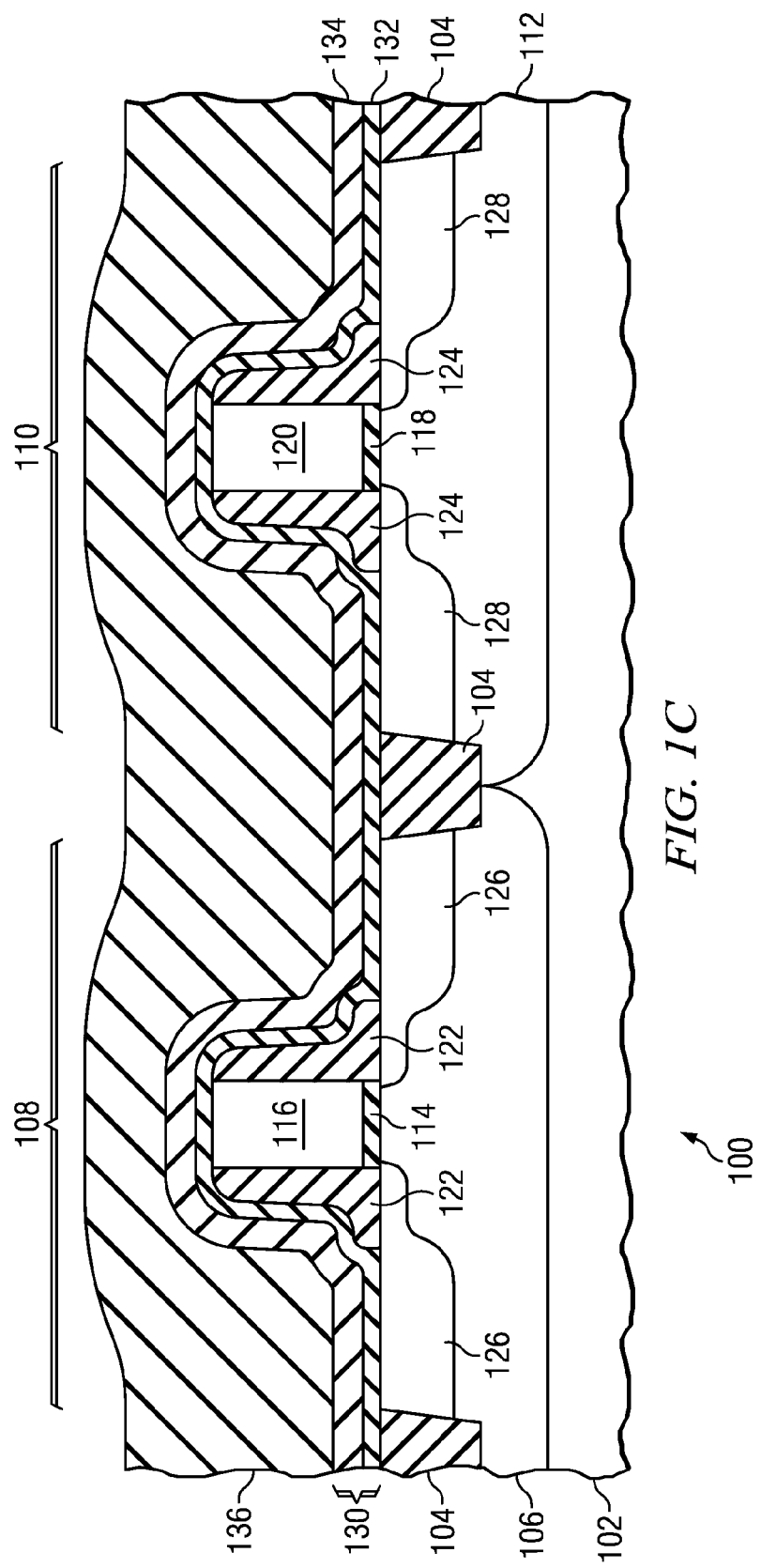
Figure 1D:
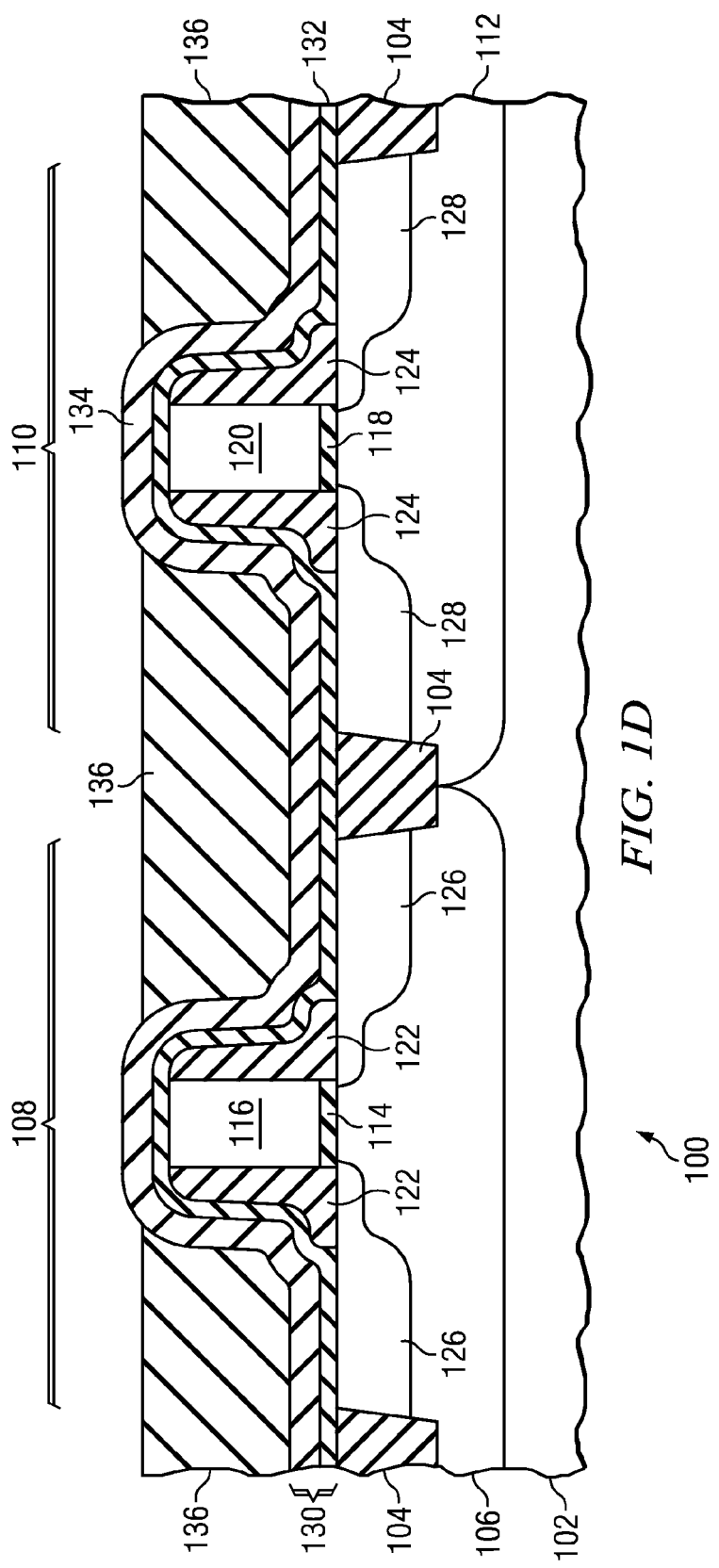
Figure 1E:
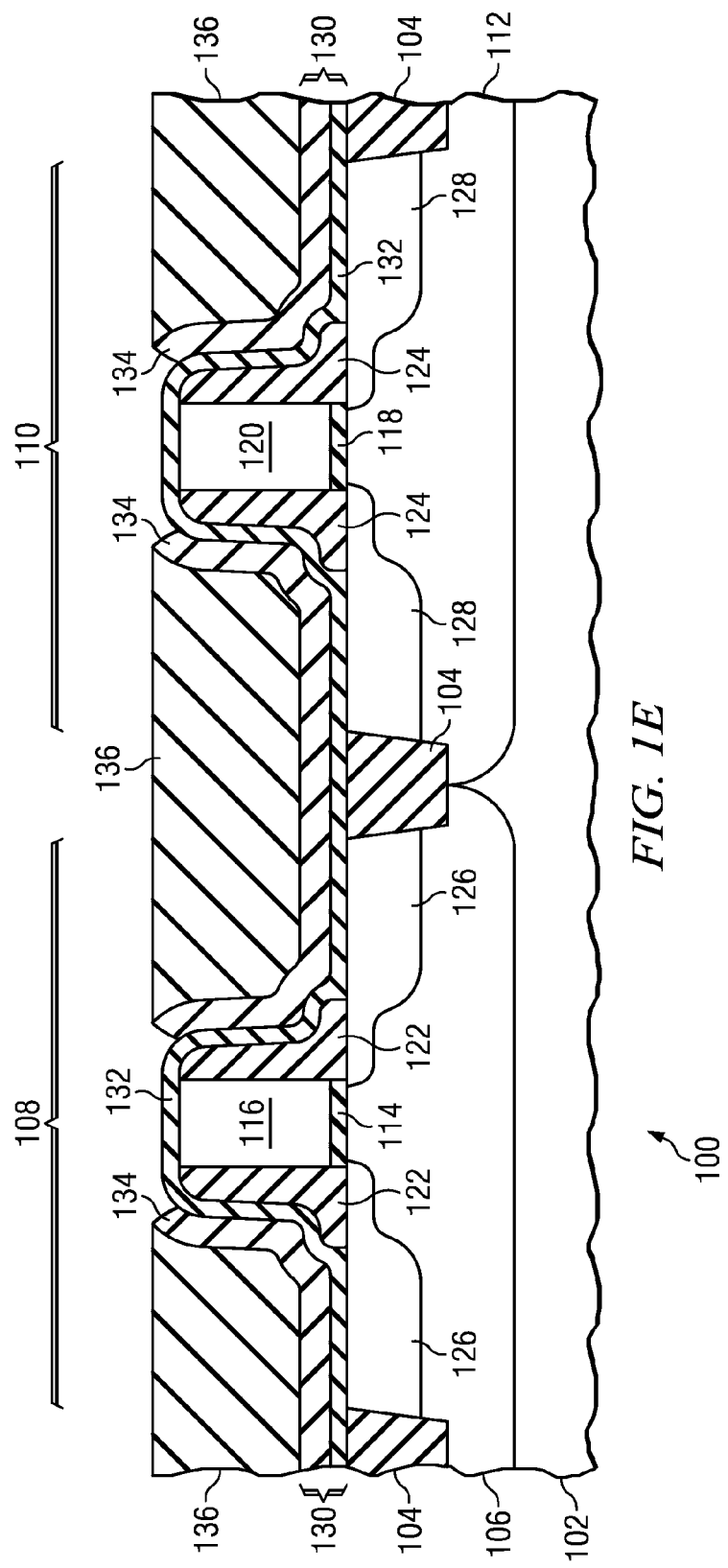
Figure 1F:
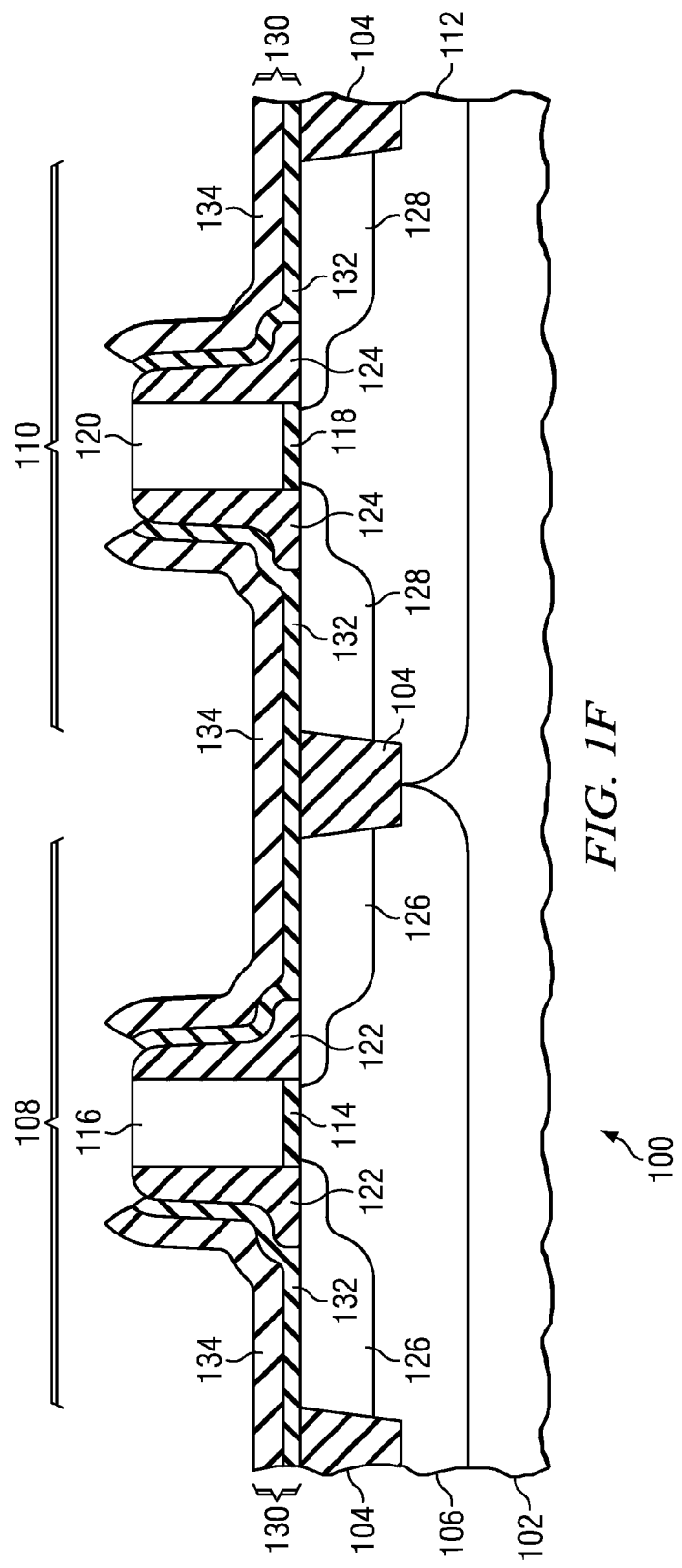
Figure 1G:
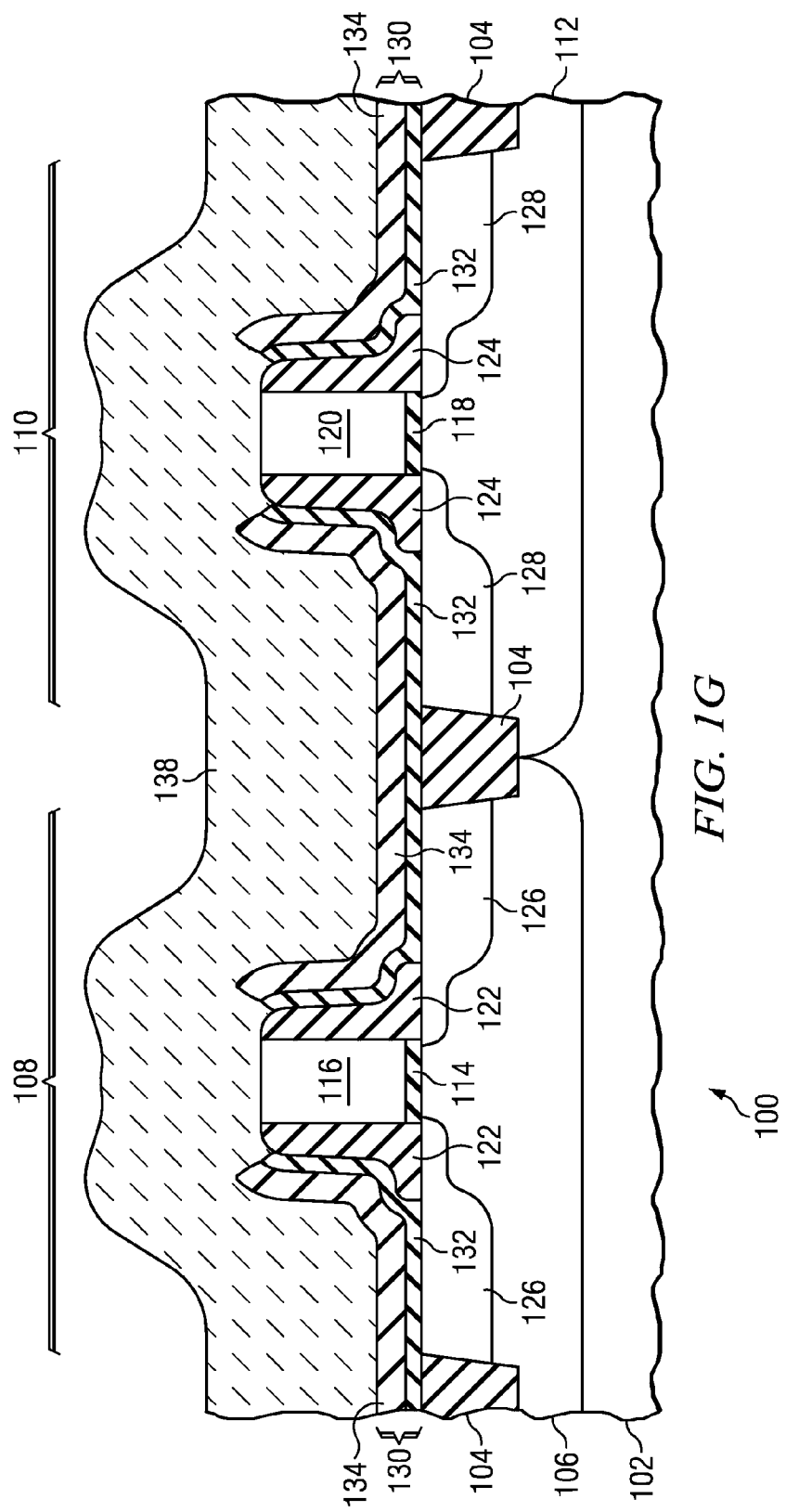
Figure 1H:
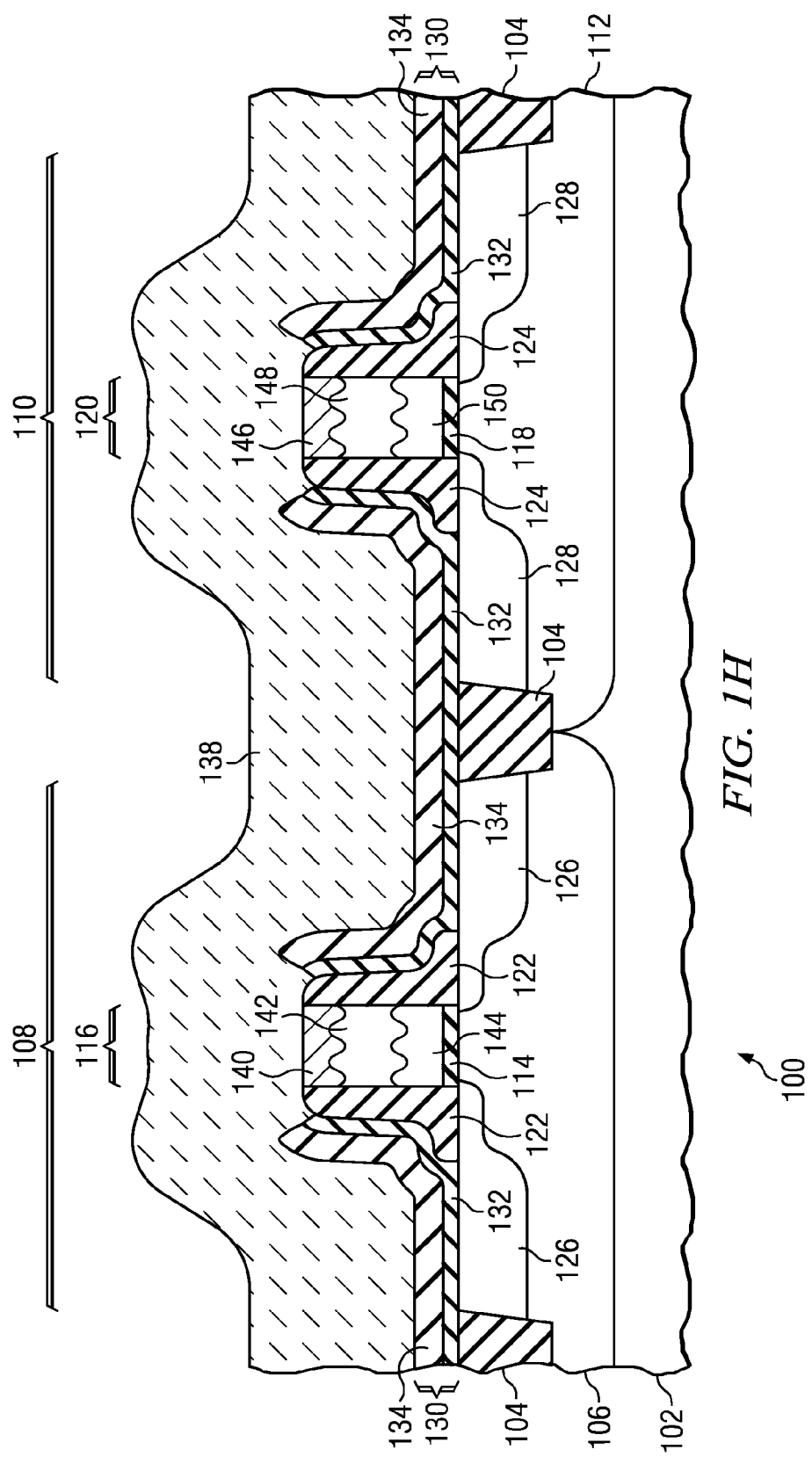
Figure 1I:
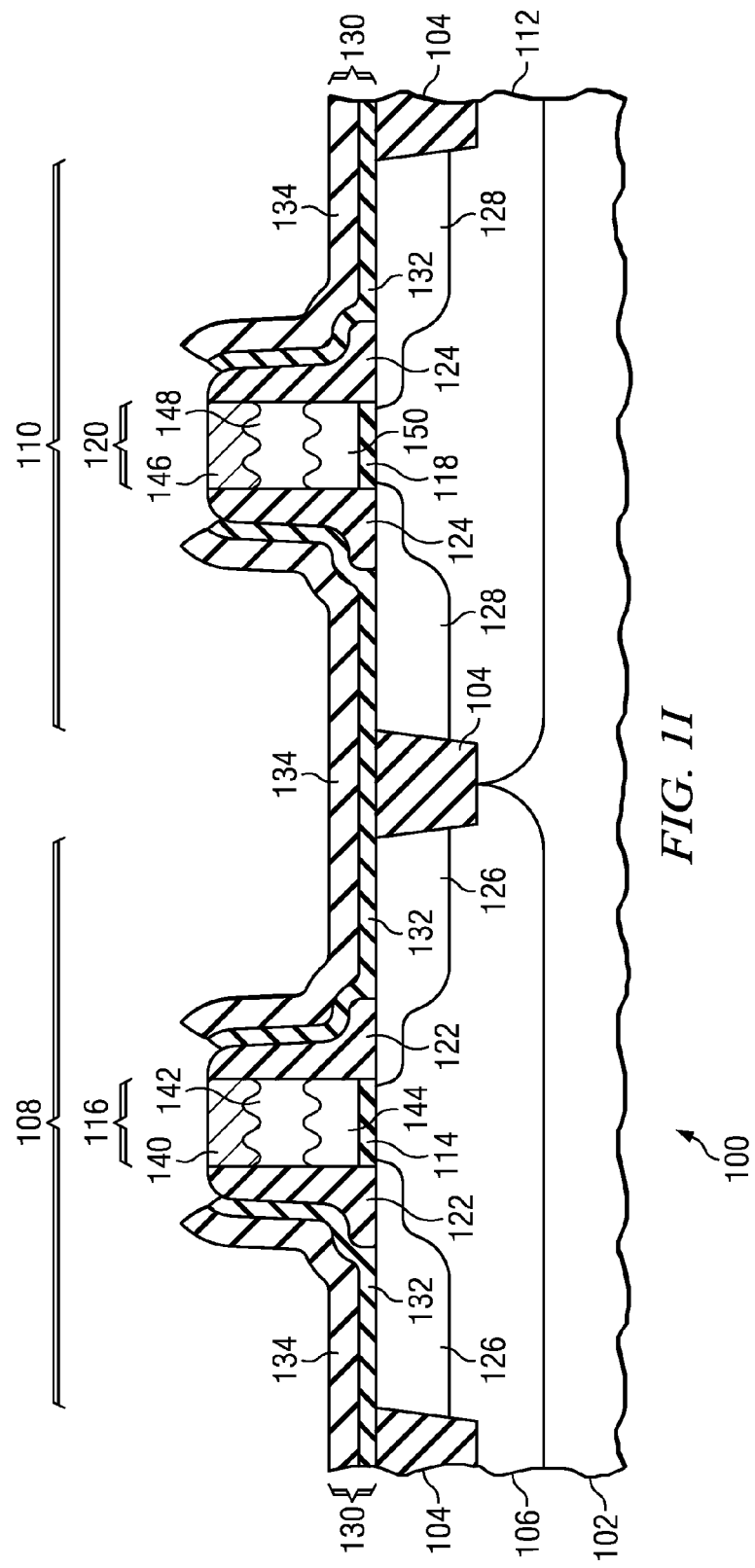
Figure 1J:
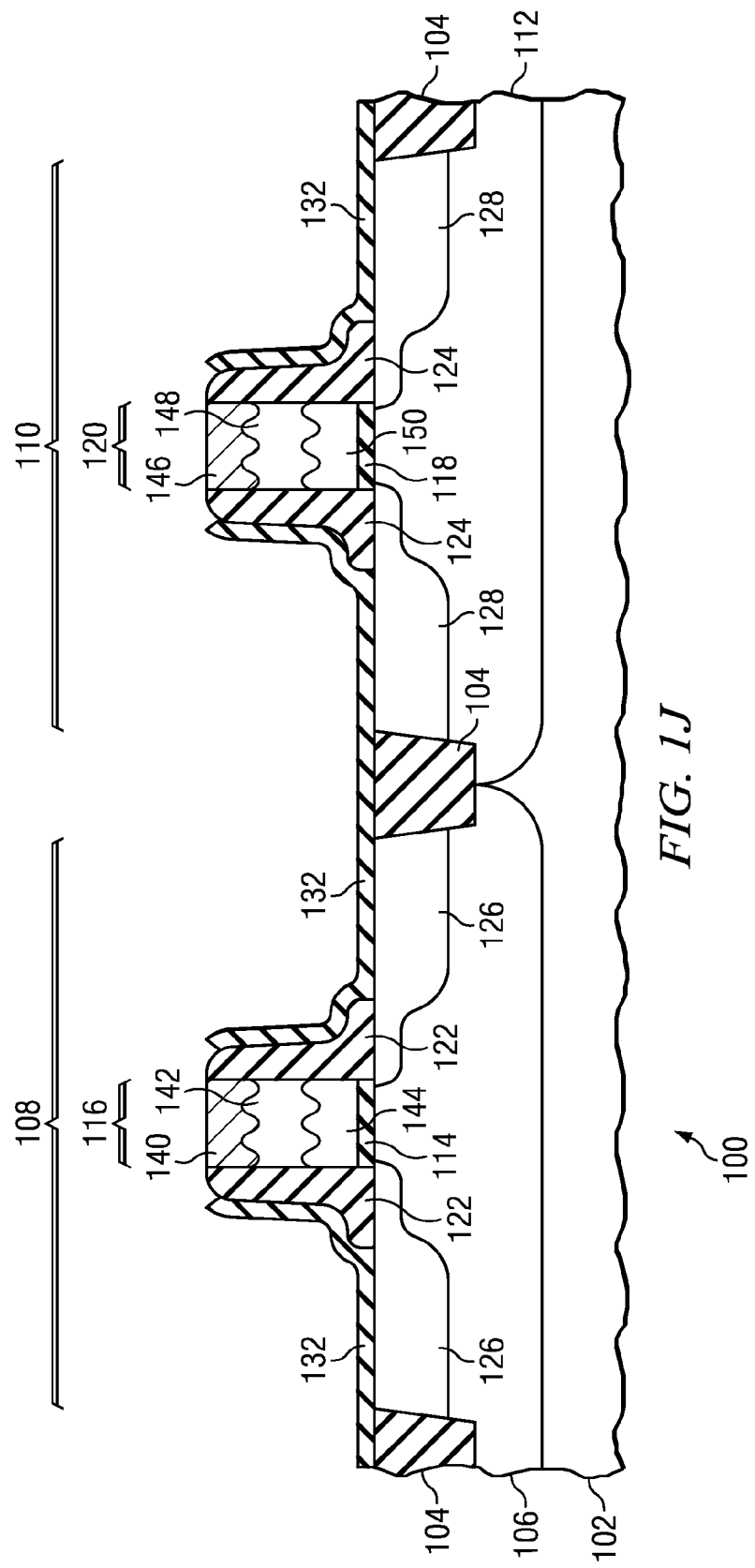
Figure 1K:
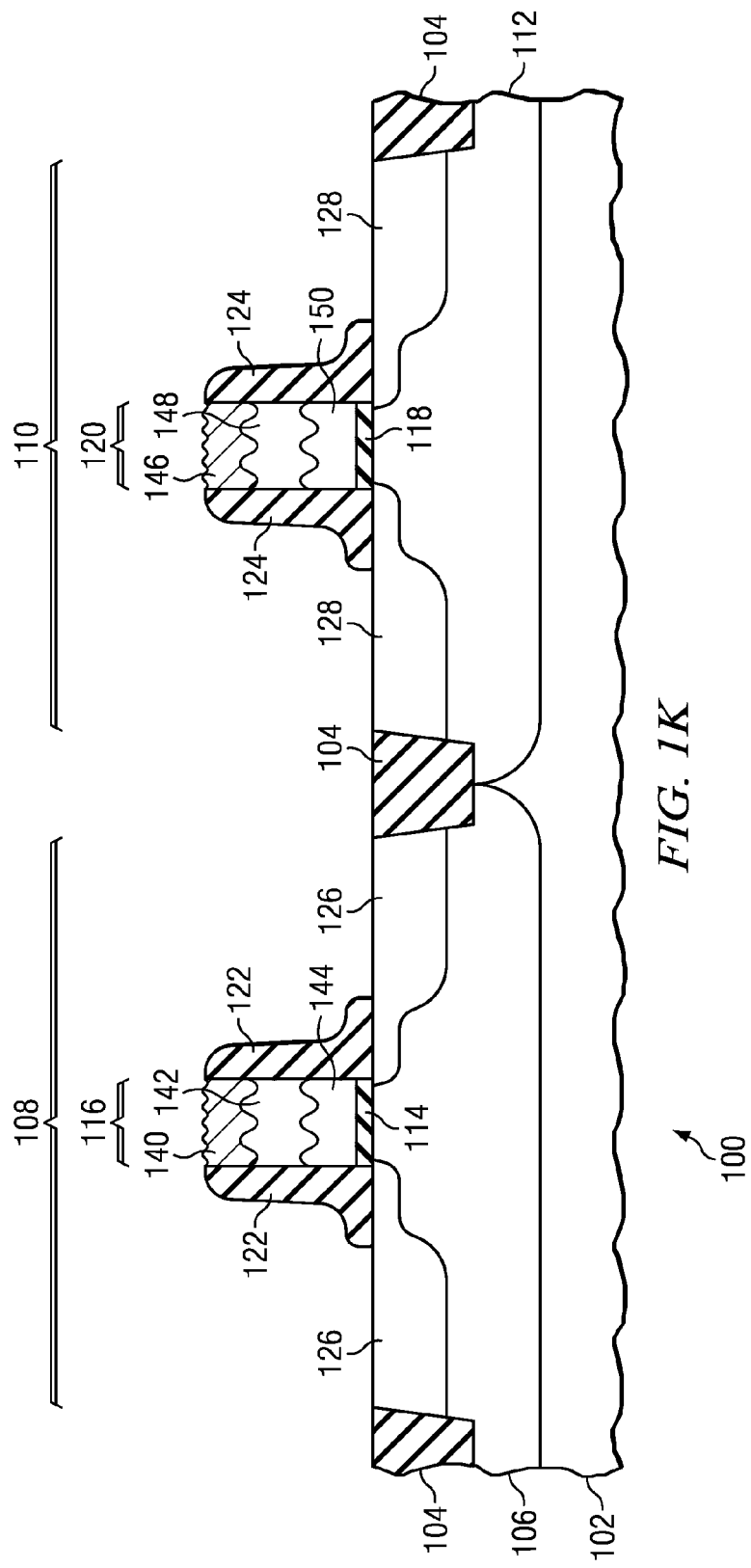
Figure 1L:
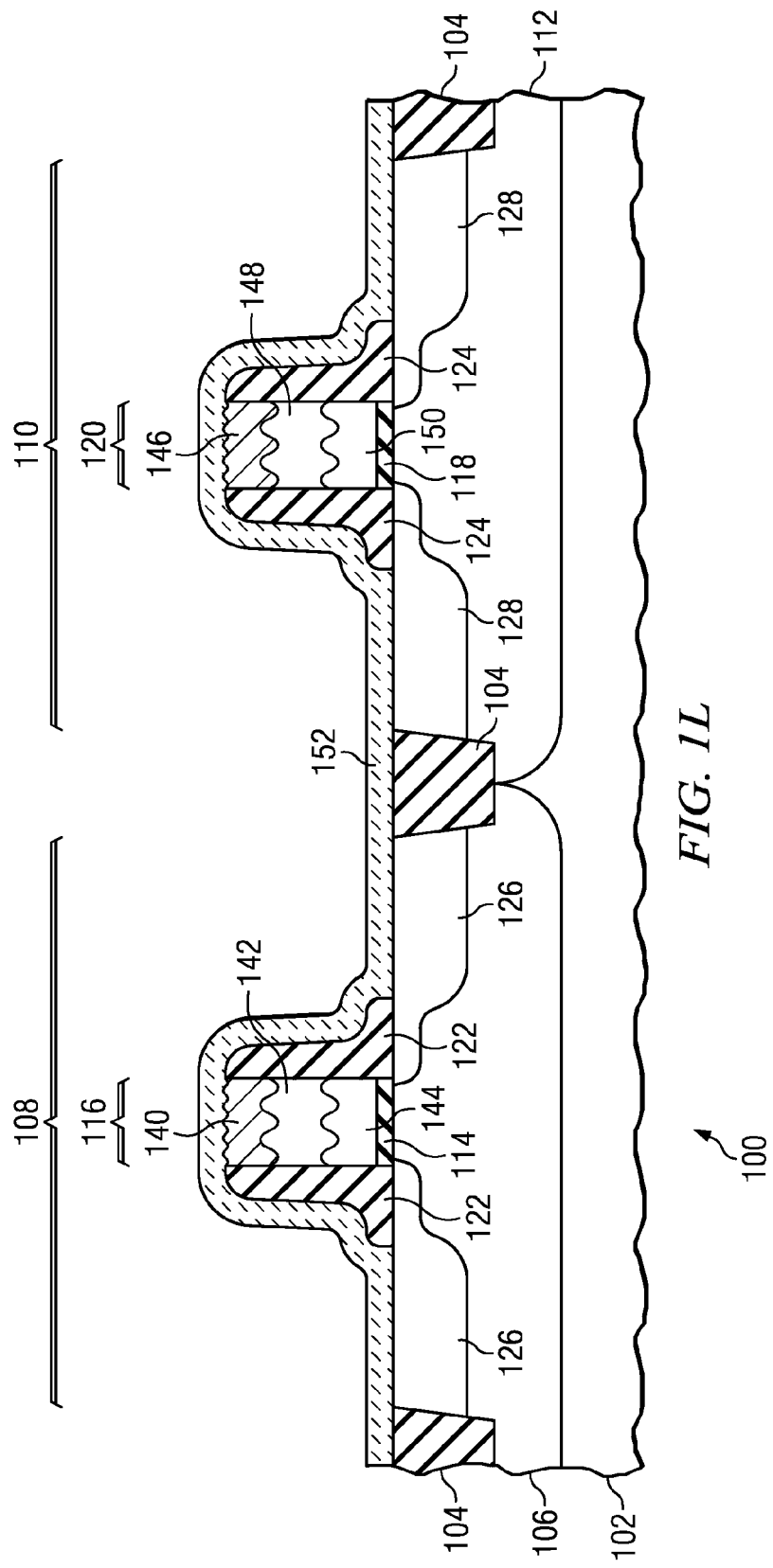
Figure 1M:
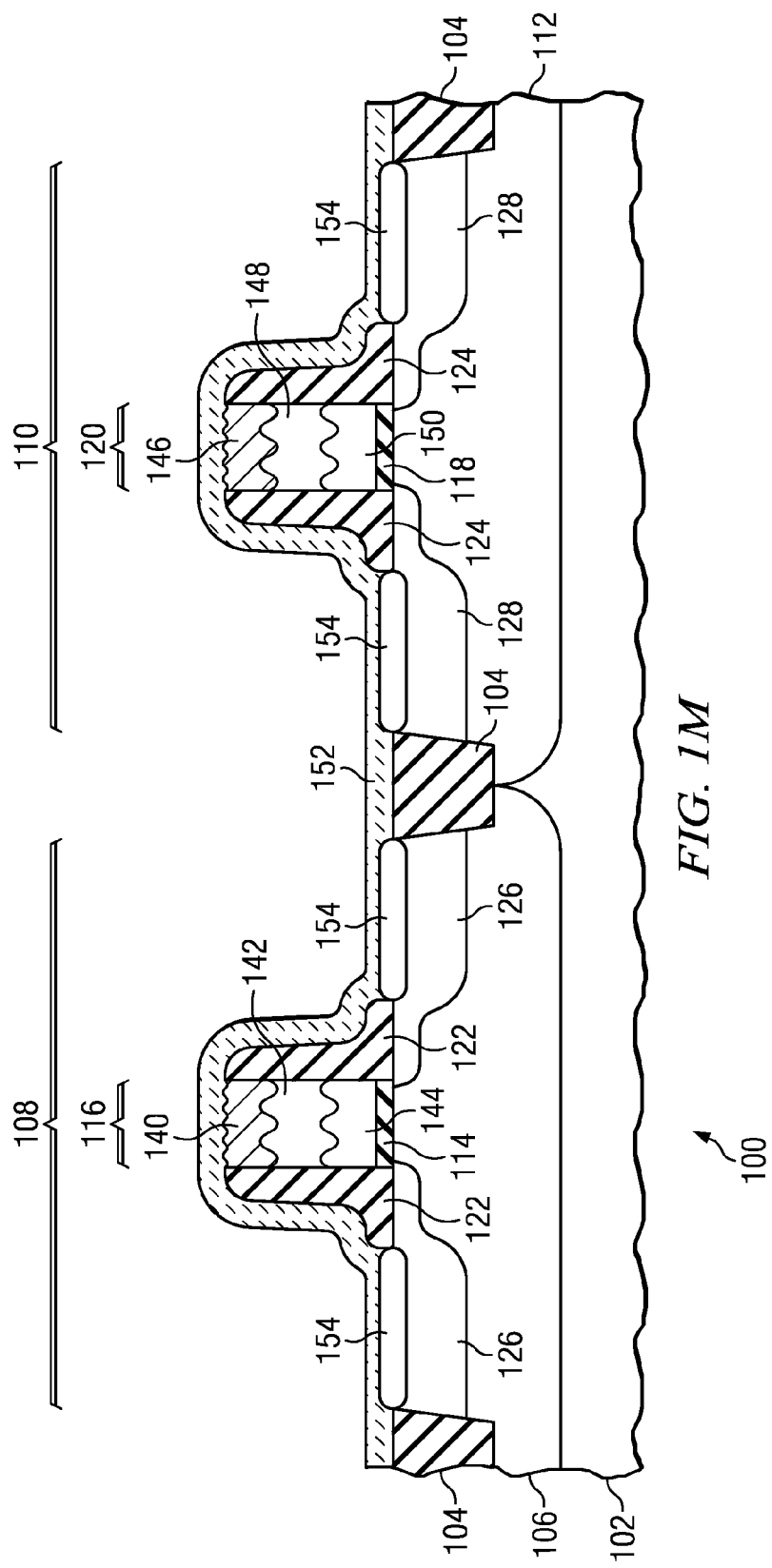
Figure 1N:
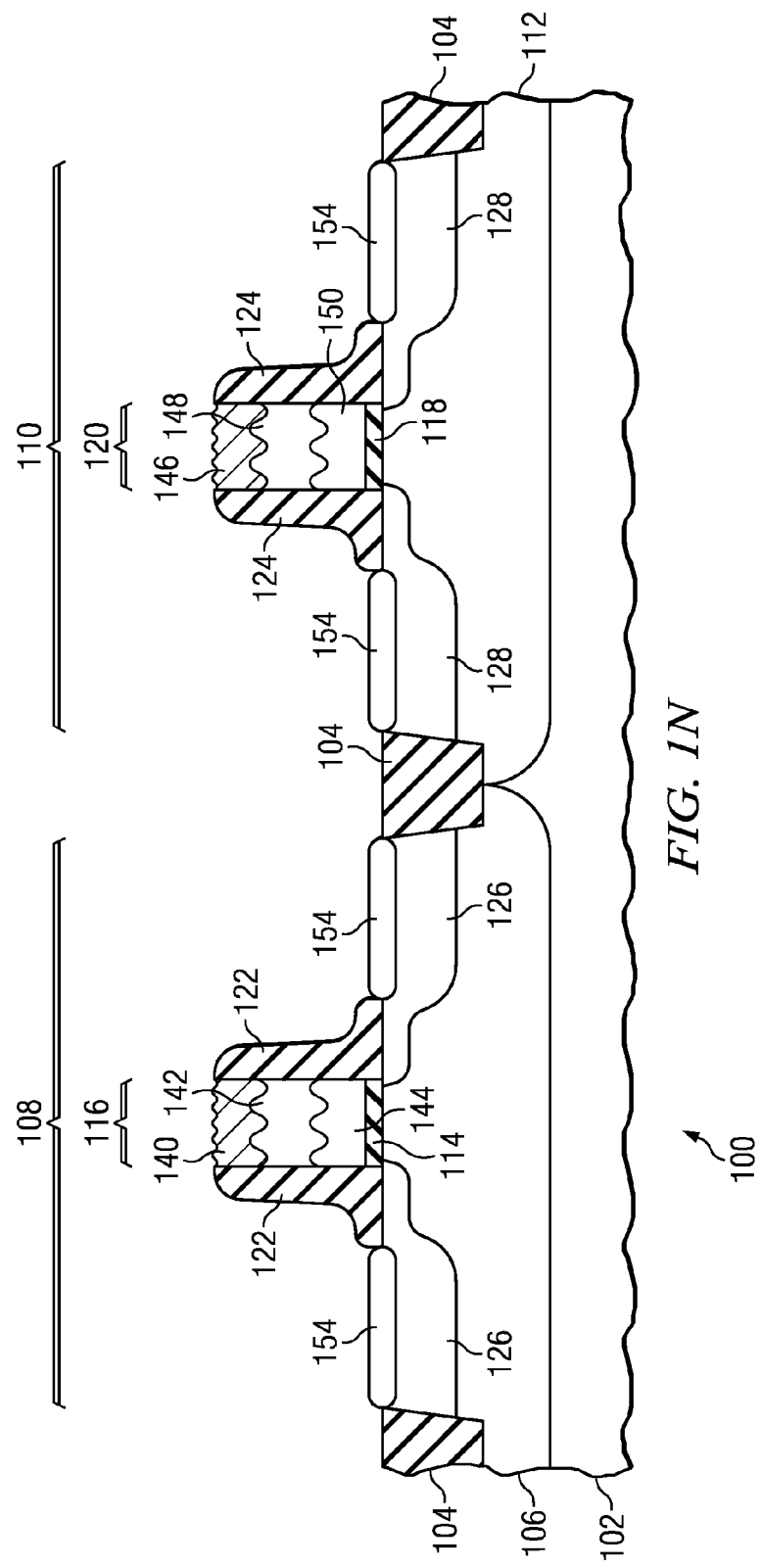
Figure 10:
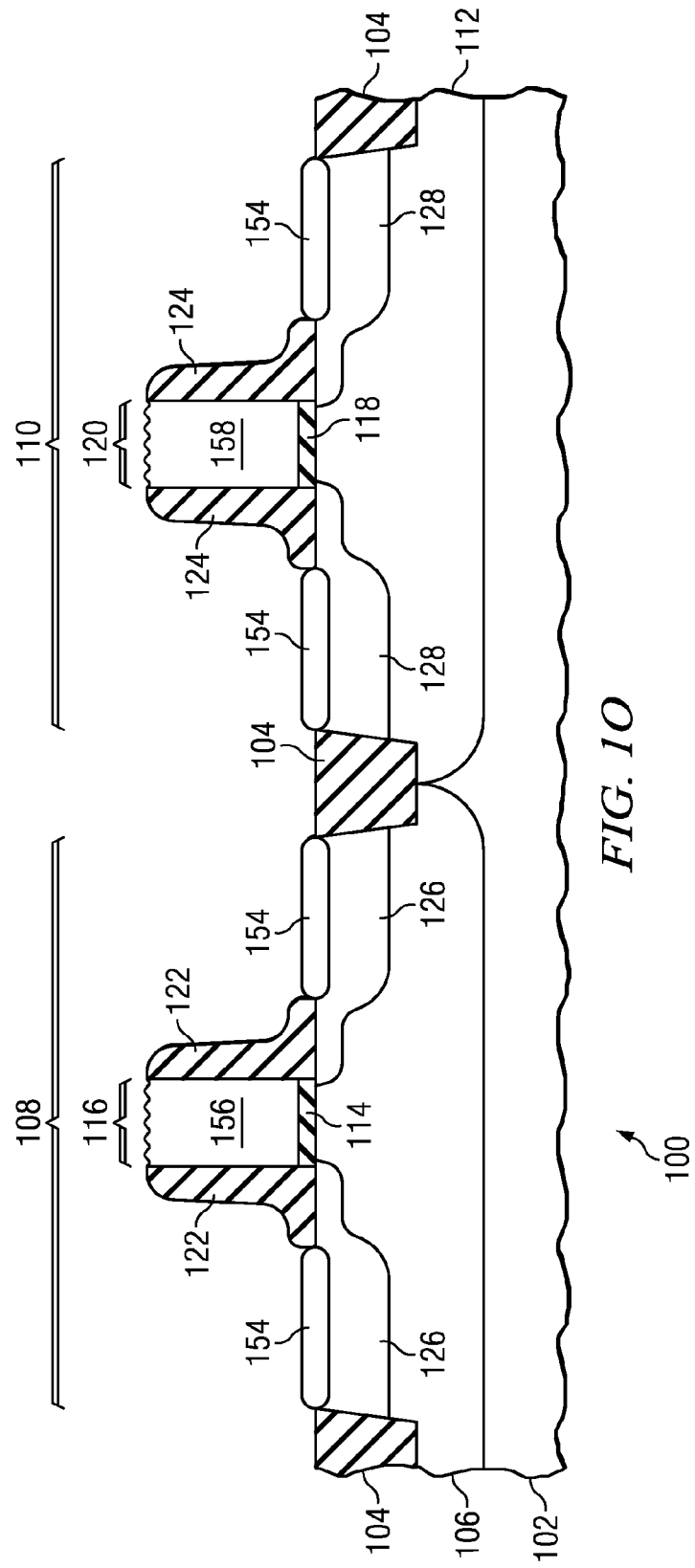
Figure 1P:
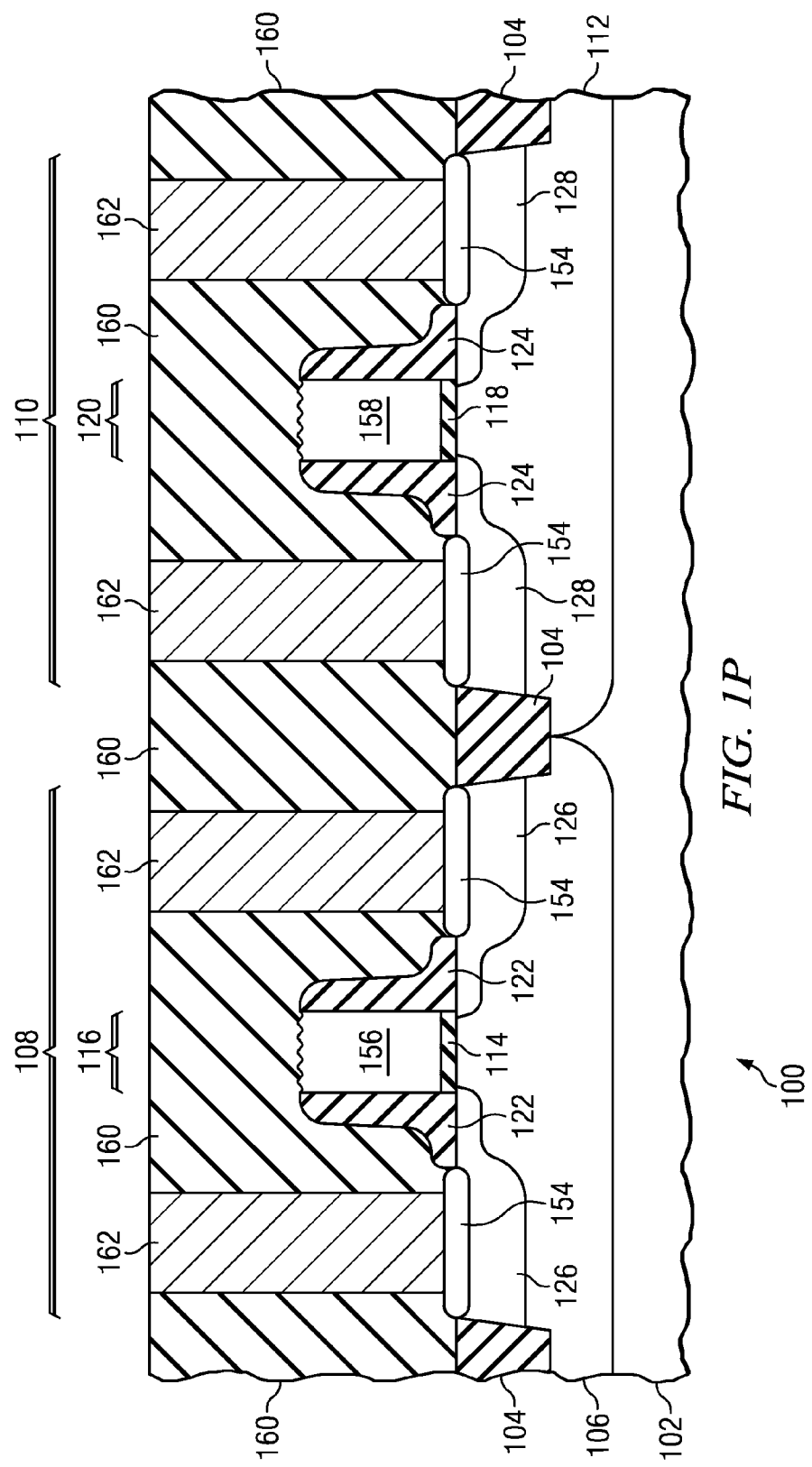

FIG. 1A through FIG. 1P are cross-sections of an IC containing an n-channel MOS (NMOS) transistor and a p-channel MOS (PMOS) transistor with FUSI gates formed according to the instant invention in successive stages of fabrication. Referring to FIG. 1A, the IC 100 is fabricated on a substrate 102, which is typically a p-type silicon single crystal wafer with an optional p-type epitaxial layer on a top surface, but is possibly a wafer with a silicon-germanium epitaxial layer on a top surface, or a hybrid orientation technology substrate which contains silicon or silicon-germanium regions of different crystal orientations for NMOS and PMOS transistors, or any other substrate suitable for forming an IC containing NMOS and PMOS transistors. Elements of field oxide 104 are formed at a top surface of the substrate 102 by a shallow trench isolation (STI) process sequence, in which trenches, commonly 200 to 500 nanometers deep, are etched into the IC 100, electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as a high aspect ratio process (HARP). A p-type well 106, commonly called a p-well, is formed in the substrate 102, typically by ion implanting a first set of p-type dopants, including boron and possibly gallium and/or indium, at doses from $1 \cdot 10^{11}$ to $1 \cdot 10^{14}$ atoms/cm$^2$, into a region defined for an NMOS transistor 108. A p-well photoresist pattern, not shown in FIG. 1A for clarity, is commonly used to block the first set of p-type dopants from a region defined for a PMOS transistor 110. The p-well 106 extends from a top surface of the substrate 102 to a depth typically 50 to 500 nanometers below a bottom surface of the field oxide elements 104. The ion implantation process to form the p-well 106 may include additional steps to implant additional p-type dopants at shallower depths for purposes of improving NMOS transistor performance, such as threshold adjustment, leakage current reduction and suppression of parasitic bipolar operation. Similarly, an n-type well 112, commonly called an n-well, is formed in the substrate 102 adjacent to the p-well 106, typically by ion implanting a first set of n-type dopants, including phosphorus and arsenic, and possibly antimony, at doses from $1 \cdot 10^{11}$ to $1 \cdot 10^{14}$ atoms/cm$^2$, into a region defined for the PMOS transistor 110. An n-well photoresist pattern, not shown in FIG. 1A for clarity, is commonly used to block the first set of n-type dopants from the region defined for the NMOS transistor 108. The n-well 112 extends from the top surface of the substrate 102 to a depth typically 50 to 500 nanometers below the bottom surface of the field oxide elements 104. The ion implantation process to form the n-well 112 may include additional steps to implant additional n-type dopants at shallower depths for purposes of improving PMOS transistor performance, such as threshold adjustment, leakage current reduction and suppression of parasitic bipolar operation. A sheet resistivity of the n-well 112 is commonly between 100 and 1000 ohms/square.

Continuing to refer to FIG. 1A, an NMOS gate dielectric layer 114, typically silicon dioxide, nitrogen doped silicon dioxide, silicon oxy-nitride, hafnium oxide, layers of silicon dioxide and silicon nitride, or other insulating material, is formed on a top surface of the p-well 106. An NMOS gate 116 of polycrystalline silicon, commonly known as polysilicon, is formed on a top surface of the NMOS gate dielectric layer 114, typically by deposition of a polysilicon layer between 50 and 150 nanometers thick on the top surface of the NMOS gate dielectric layer 114, followed by formation of an NMOS gate photoresist pattern by known photolithographic methods, not shown in FIG. 1A for clarity, which defines a region for the NMOS gate 116, subsequently followed by removal of unwanted polysilicon by known etching methods. After etching the polysilicon layer to from the NMOS gate 116, the NMOS gate photoresist pattern is removed, commonly by exposing the IC 100 to an oxygen containing plasma, followed by a wet cleanup to remove any organic residue from the top surface of the NMOS gate 116. Similarly, a PMOS gate dielectric layer 118, also typically silicon dioxide, nitrogen doped silicon dioxide, silicon oxy-nitride, hafnium oxide, layers of silicon dioxide and silicon nitride, or other insulating material, is formed on a top surface of the n-well 112. A PMOS gate 120, also polysilicon, is formed on a top surface of the PMOS gate dielectric layer 118, in a manner similar to the formation of the NMOS gate 116. It is common to form one gate photoresist pattern which defines both the NMOS gate 116 and the PMOS gate 120 and to form both gates 116, 120 in the same etching process.

Still referring to FIG. 1A, NMOS gate sidewall spacers 122 are formed on lateral surfaces of the NMOS gate 116, typically by deposition of one or more conformal layers of silicon nitride and/or silicon dioxide on a top and lateral surfaces of the NMOS gate 116 and the top surface of the p-well 106, followed by removal of the conformal layer material from the top surface of the NMOS gate 116 and the top surface of the p-well 106 by known anisotropic etching methods, leaving the conformal layer material on the lateral surfaces of the NMOS gate 116. Similarly, PMOS gate sidewall spacers 124 are formed on lateral surfaces of the PMOS gate 120 by a similar process sequence. N-type source and drain (NSD) regions 126 are formed in the p-well 106, adjacent to the NMOS gate 116, typically by ion implanting a second set of n-type dopants, including phosphorus and arsenic, and possibly antimony, at a total dose between $1 \cdot 10^{14}$ and $3 \cdot 10^{16}$ atoms/cm$^2$, into areas defined for the NSD regions 126. An NSD photoresist pattern, not shown in FIG. 1A for clarity, is commonly used to block the second set of n-type dopants from areas outside the NSD regions. The NSD regions 126 typically extend from the top surface of the p-well 106 to a depth between 50 and 200 nanometers. Similarly, p-type source and drain (PSD) regions 128, are formed in the n-well 112, typically by ion implanting a second set of p-type dopants, including boron, commonly in the form BF$_2$, and possibly gallium and/or indium, at a total dose between $1 \cdot 10^{14}$ and $3 \cdot 10^{16}$ atoms/cm$^2$, into areas defined for the PSD regions 128. A PSD photoresist pattern, not shown in FIG. 1A for clarity, is commonly used to block the second set of p-type dopants from areas outside the PSD regions. The PSD regions 128 typically extend from the top surface of the n-well 112 to a depth between 50 and 200 nanometers.

FIG. 1B depicts the IC 100 at a subsequent stage of fabrication. A source/drain protective layer 130, which commonly includes a source/drain conformal oxide layer 132, typically 1 to 25 nanometers of silicon dioxide, and a source/drain conformal nitride layer 134, typically 5 to 25 nanometers of silicon nitride, is formed on the top and lateral surfaces of the NMOS and PMOS gates 116, 120 and p-well and n-well 106, 112 by known conformal deposition methods, including plasma enhanced chemical vapor deposition (PECVD) or reaction of bis (tertiary-butylamino) silane (BTBAS).

FIG. 1C depicts the IC 100 after deposition of a planarizing oxide layer 136 on a top surface of the source/drain protective layer 130. The planarizing oxide layer 136 is substantially composed of silicon dioxide, and may be formed by known methods of reaction of tetraethyoxysilane (TEOS) on the top surface of the source/drain protective layer 130 or application of methylsilsesquioxane (MSQ) to the top surface of the source/drain protective layer 130. Other methods of forming a planarizing layer of silicon dioxide on the top surface of the source/drain protective layer 130 are within the scope of the instant invention.

FIG. 1D depicts the IC 100 after a chemical mechanical polish (CMP) operation which removes a portion of the planarizing oxide layer 136 to expose the source/drain protective layer 130 on the top surface of the NMOS and PMOS gates 116, 120. The CMP process is performed using known polishing methods, in which the silicon dioxide in the planarizing oxide layer 136 is removed at a faster rate than the silicon nitride in the source/drain conformal nitride layer 134. After the CMP operation is completed, the source/drain protective layer 130 on lateral surfaces of the NMOS and PMOS gates 116, 120 and on top surfaces of the p-well and n-well 106, 112 are covered by the planarizing oxide layer 136.

FIG. 1E depicts the IC 100 after a first gate silicide protective layer removal etch process which removes a portion of the source/drain protective layer 130 over the top surfaces of the NMOS and PMOS gates 116, 120. In a preferred embodiment, the first gate silicide protective layer removal etch process removes the source/drain conformal nitride layer 134 over the top surfaces of the NMOS and PMOS gates 116, 120 and leaves silicon dioxide in the source/drain conformal oxide layer 132. The first gate silicide protective layer removal etch process may be performed by a wet etch of phosphoric acid or a plasma etch by fluorine atoms.

FIG. 1F depicts the IC 100 after a second gate silicide protective layer removal etch process which removes any remaining material in the source/drain protective layer 130 over the top surfaces of the NMOS and PMOS gates 116, 120. The silicon dioxide in the planarizing oxide layer is substantially removed during the second gate silicide protective layer removal etch process. In a preferred embodiment of the second gate silicide protective layer removal etch process, the silicon dioxide in the source/drain conformal oxide layer 132 on top surfaces of the NMOS and PMOS gates 116, 120 and the silicon dioxide in the planarizing oxide layer are removed by an aqueous etch of dilute, possibly buffered, hydrofluoric acid. Any process of removing any remaining material in the source/drain protective layer 130 over the top surfaces of the NMOS and PMOS gates 116, 120 and the silicon dioxide in the planarizing oxide layer is within the scope of the instant invention.

FIG. 1G depicts the IC 100 after deposition of a gate metal layer 138 on top surfaces of the NMOS and PMOS gates 116, 120 and the source/drain protective layer 130. In a preferred embodiment, the gate metal layer 138 is composed of nickel or a mixture of nickel and platinum, between 50 and 150 nanometers thick. Forming the gate metal layer 138 of other known metals, such as cobalt, is within the scope of the instant invention.

FIG. 1H depicts the IC 100 after a gate silicide form process, in which the IC 100 is heated to react gate metal in the gate metal layer 138 with polysilicon in the NMOS and PMOS gates 116, 120. The gate silicide form process results in an NMOS metal rich silicide layer 140 at the top surface of the NMOS gate 116, in which an atomic ratio of metal atoms to silicon atoms is significantly higher than the desired stoichiometry of a final NMOS FUSI material. In a preferred embodiment, the atomic ratio of metal atoms to silicon atoms is more than 50 percent higher than the desired stoichiometry of a final NMOS FUSI material. In an embodiment in which the gate metal is nickel or a mixture of nickel and platinum, the NMOS metal rich silicide layer 140 is preferably mostly $Ni_2Si$, while the desired stoichiometry of the final NMOS FUSI material is NiSi.

The gate silicide form process also results in an intermediate NMOS silicide layer 142 in the NMOS gate 116 below the NMOS metal rich silicide layer 140, in which an atomic ratio of metal atoms to silicon atoms is significantly less than in the NMOS metal rich silicide layer 140, and may be close to the desired stoichiometry of a final NMOS FUSI material. In one embodiment, the atomic ratio of metal atoms to silicon atoms in the intermediate NMOS silicide layer 142 may be 25 percent less than in the NMOS metal rich silicide layer 140. In the embodiment in which the gate metal is nickel or a mixture of nickel and platinum, the intermediate NMOS silicide layer 142 may be mostly NiSi.

An NMOS metal deficient silicide region 144, in which an atomic ratio of metal atoms to silicon atoms is significantly less than the desired stoichiometry of a final NMOS FUSI material, may be formed in the NMOS gate 116 below the intermediate NMOS silicide layer 142. In one embodiment, the atomic ratio of metal atoms to silicon atoms in the NMOS metal deficient silicide region 144 may be 25 percent less than in the intermediate NMOS silicide layer 142. In the embodiment in which the gate metal is nickel or a mixture of nickel and platinum, the Ni:Si stoichiometry of the NMOS metal deficient silicide region 144 may be less than 0.5:1.

Similarly, the gate silicide form process produces a PMOS metal rich silicide layer 146 at the top surface of the PMOS gate 120 in which an atomic ratio of metal atoms to silicon atoms is significantly higher than the desired stoichiometry of a final PMOS FUSI material. In a preferred embodiment, the atomic ratio of metal atoms to silicon atoms is more than 50 percent higher than the desired stoichiometry of a final PMOS FUSI material. In the embodiment in which the gate metal is nickel or a mixture of nickel and platinum, the PMOS metal rich silicide layer 146 is also preferably mostly $Ni_2Si$. A thickness and metal content of the PMOS metal rich silicide layer 146 may be different from a thickness and metal content of the NMOS metal rich silicide layer 140.

The gate silicide form process also produces an intermediate PMOS silicide layer 148 in the PMOS gate 120 below the PMOS metal rich silicide layer 146, in which an atomic ratio of metal atoms to silicon atoms is significantly less than in the PMOS metal rich silicide layer 146, and may be close to a desired stoichiometry of the final PMOS FUSI material. In one embodiment, the atomic ratio of metal atoms to silicon atoms in the intermediate PMOS silicide layer 148 may be 25 percent less than in the PMOS metal rich silicide layer 146. In the embodiment in which the gate metal is nickel or a mixture of nickel and platinum, the intermediate PMOS silicide layer 148 may be mostly NiSi. A thickness and metal content of the intermediate PMOS silicide layer 148 may be different from a thickness and metal content of the intermediate NMOS silicide layer 142.

A PMOS metal deficient silicide region 150, in which an atomic ratio of metal atoms to silicon atoms is significantly less than the desired stoichiometry of the final PMOS FUSI material, may be formed in the PMOS gate 120 below the intermediate PMOS silicide layer 150. In one embodiment, the atomic ratio of metal atoms to silicon atoms in the PMOS metal deficient silicide region 150 may be 25 percent less than in the intermediate PMOS silicide layer 148. In the embodiment in which the gate metal is nickel or a mixture of nickel and platinum, the Ni:Si stoichiometry of the PMOS metal deficient silicide region 150 may be less than 0.5:1.

FIG. 1I depicts the IC 100 after a gate metal strip process in which unreacted gate metal in the gate metal layer is removed. The gate metal strip process is typically performed as a wet etch process, commonly using a mixture of sulfuric acid and hydrogen peroxide. Metal and silicon in the NMOS metal rich silicide layer 140 and PMOS metal rich silicide layer 146 are not substantially removed by the gate metal strip process.

FIG. 1J depicts the IC 100 after a source/drain conformal nitride layer etch process in which the silicon nitride in the source/drain conformal nitride layer is removed. In a preferred embodiment, the source/drain conformal nitride layer etch process is performed using known methods of etching silicon nitride with a fluorine containing plasma. Metal and silicon in the NMOS metal rich silicide layer 140 and PMOS metal rich silicide layer 146 are not substantially removed by the source/drain conformal nitride layer etch process. After the source/drain conformal nitride layer etch process, it is common to perform a dry etch wet cleanup process to remove residue of the source/drain conformal nitride layer etch process from a top surface of the source/drain conformal oxide layer 132. Advantageously, metal and silicon in the NMOS metal rich silicide layer 140 and PMOS metal rich silicide layer 146 are not substantially removed by the dry etch wet cleanup process, due to the atomic ratios of metal atoms to silicon atoms being significantly higher than the desired stoichiometry of the final NMOS and PMOS FUSI materials, respectively.

FIG. 1K depicts the IC 100 after a source/drain conformal oxide layer etch process in which the source/drain conformal oxide layer is removed from top surfaces of the NSD 126 and PSD 128 regions. Metal and silicon in the NMOS metal rich silicide layer 140 and PMOS metal rich silicide layer 146 are not substantially removed by the source/drain conformal oxide layer etch process.

FIG. 1L depicts the IC 100 after deposition of a source/drain metal layer 152 on top surfaces of the NSD and PSD regions 126, 128 and NMOS and PMOS gates 116, 120. In a preferred embodiment, the source/drain metal layer 152 is composed of nickel or a mixture of nickel and platinum, between 10 and 100 nanometers thick. Forming the source/drain metal layer 152 of other known metals, such as cobalt, is within the scope of the instant invention.

FIG. 1M depicts the IC 100 after formation of source/drain silicide layers 154 by a source/drain silicide form process in which the IC 100 is heated to react source/drain metal in the source/drain metal layer 152 with exposed silicon in the NSD and PSD regions 126, 128.

FIG. 1N depicts the IC 100 after a source/drain metal strip process in which unreacted source/drain metal in the source/drain metal layer is removed. The source/drain metal strip process is typically performed as a wet etch process, commonly using a mixture of sulfuric acid and hydrogen peroxide. Advantageously, metal and silicon in the NMOS metal rich silicide layer 140 and PMOS metal rich silicide layer 146 are not substantially removed by the source/drain metal strip process, due to the atomic ratios of metal atoms to silicon atoms being significantly higher than the desired stoichiometry of the final NMOS and PMOS FUSI materials, respectively.

FIG. 1O depicts the IC 100 after a gate silicide anneal process in which the IC 100 is heated to further react the gate metal and silicon in the NMOS gate and PMOS gate 116, 120 to form silicide with the desired FUSI stoichiometry, resulting in an NMOS FUSI gate 156 and a PMOS FUSI gate 158. Preservation of the metal rich silicide layer 140 in FIG. 2 advantageously increases a process latitude of the gate silicide anneal process with regard to attaining the desired FUSI stoichiometry. In a preferred embodiment, desired stoichiometries in the source/drain silicide layers 154 are attained during the gate silicide anneal process. In an alternate embodiment, a separate source/drain silicide anneal process is performed to attain desired stoichiometries in the source/drain silicide layers 154.

FIG. 1P depicts the IC 100 after formation of a first set of interconnect elements. A pre-metal dielectric layer (PMD) 160, typically a dielectric layer stack including a silicon nitride or silicon dioxide PMD liner 10 to 100 nanometers thick deposited by PECVD, a layer of silicon dioxide, phospho-silicate glass (PSG) or boro-phospho-silicate glass (BPSG), commonly 100 to 1000 nanometers thick deposited by PECVD, commonly leveled by a CMP process, and an optional PMD cap layer, commonly 10 to 100 nanometers of a hard material such as silicon nitride, silicon carbide nitride or silicon carbide, is formed on top surfaces of the NMOS and PMOS gates 116, 120 and source/drain silicide layers 154. Contacts 162 are formed in the PMD 160, typically by defining areas for contacts with a contact photoresist pattern, not shown in FIG. 1P for clarity, using known photolithographic methods, etching contact holes in the contact areas using known contact hole etching methods to expose the source/drain silicide layers 154, and filling the contact holes with a contact metal, commonly tungsten, possibly with an optional contact liner metal, commonly titanium, titanium nitride, tantalum or tantalum nitride. Electrical connections to the contacts 162 are made by interconnect elements in subsequent IC fabrication processes.

What is claimed is:

1. A method of forming a fully silicided (FUSI) gate, comprising the steps of:
    forming a protective layer on a top surface of a polysilicon gate and a top surface of areas adjacent to said gate;
    selectively removing said protective layer over said gate whereby said protective layer is not removed from said adjacent areas;
    forming a layer of gate metal on a top surface of said gate;
    heating said gate metal and said gate so as to form a gate silicide layer in a top region of said gate with an atomic ratio of metal atoms to silicon atoms which is more than 50 percent higher than a desired FUSI stoichiometry of said FUSI gate;
    after heating said gate metal and gate, removing said protective layer from said adjacent areas whereby said gate silicide layer in said top region of said gate is not substantially removed;
    forming a layer of source/drain metal on said adjacent areas;
    heating said source/drain metal and said adjacent areas so as to form source/drain silicide layers in top regions of said adjacent areas subsequent to heating the gate metal and gate;
    then, removing unreacted source/drain metal by a process further comprising wet etching, whereby said gate silicide layer in said top region of said gate is not substantially removed; and
    after removing the unreacted source/drain metal, annealing said gate and said gate silicide layer in said top region of said gate to form a FUSI gate which has said desired FUSI stoichiometry.

2. The method of claim 1, in which said step of annealing said gate and said gate silicide layer also produces a desired source/drain silicide stoichiometry in said source/drain silicide layers.

3. The method of claim 2, in which said gate metal is selected from the group consisting of:
    nickel, and
    a mixture of nickel and platinum.

4. The method of claim 3, in which said step of heating said gate metal and said gate so as to form a gate silicide layer in a top region of said gate produces gate silicide layer in said top region of said gate which is substantially comprised of $Ni_2Si$.

5. The method of claim 4, in which said step of forming a protective layer further comprises the steps of:
    forming a layer of silicon dioxide on a top surface of said adjacent areas; and
    forming a layer of silicon nitride on a top surface of said layer of silicon dioxide.

6. The method of claim 5, in which said source/drain metal is selected from the group consisting of:
    nickel;
    a mixture of nickel and platinum.

7. A method of forming a metal oxide semiconductor (MOS) transistor containing a FUSI gate, comprising the steps of:
    forming a protective layer on top surfaces of a polysilicon gate, gate sidewall spacers on lateral surfaces of said gate, and source/drain areas adjacent to said gate sidewall spacers;
    selectively removing said protective layer over said gate whereby said protective layer is not removed from said gate sidewall spacers or said source/drain areas;
    forming a layer of gate metal on a top surface of said gate, in which a composition of said gate metal is selected from the group consisting of nickel and a mixture of nickel and platinum;
    heating said gate metal and said gate so as to form a gate silicide layer in a top region of said gate which is substantially $Ni_2Si$;
    removing said protective layer from said source/drain areas whereby said gate silicide layer in said top region of said gate is not substantially removed;
    forming a layer of source/drain metal on said source/drain areas;
    after heating the gate metal and gate, heating said source/drain metal and said source/drain areas so as to form source/drain silicide layers in top regions of said source/drain areas;
    then, removing unreacted source/drain metal by a process further comprising wet etching, whereby said gate silicide layer in said top region of said gate is not substantially removed; and
    after removing the unreacted source/drain metal, annealing said gate and said gate silicide layer in said top region of said gate to form a FUSI gate which is substantially comprised of NiSi.

8. The method of claim 7, in which said step of annealing said gate and said gate silicide layer also produces a desired source/drain silicide stoichiometry in said source/drain silicide layers.

9. The method of claim 8, in which said step of heating said gate metal and said gate so as to form a gate silicide layer produces an intermediate silicide layer in said gate which is substantially NiSi.

10. The method of claim 9, in which said step of heating said gate metal and said gate so as to form a gate silicide layer produces a metal deficient silicide region in said gate in which an atomic ratio of metal atoms to silicon atoms in said metal deficient silicide region is 25 percent less than in said intermediate silicide layer.

11. The method of claim 10, in which said step of forming a protective layer further comprises the steps of:
    forming a layer of silicon dioxide on top surfaces of said gate, said gate sidewall spacers and said source/drain areas; and
    forming a layer of silicon nitride on a top surface of said layer of silicon dioxide.

12. The method of claim 11, in which said source/drain metal is selected from the group consisting of:
    nickel;
    a mixture of nickel and platinum.

13. A method of forming an integrated circuit, comprising the steps of:
    forming a protective layer on top surfaces of a polysilicon n-channel metal oxide semiconductor (NMOS) gate, NMOS gate sidewall spacers on lateral surfaces of said NMOS gate, n-type source/drain (NSD) areas adjacent to said NMOS gate sidewall spacers, polysilicon p-channel metal oxide semiconductor (PMOS) gate, PMOS gate sidewall spacers on lateral surfaces of said PMOS gate, and p-type source/drain (PSD) areas adjacent to said PMOS gate sidewall spacers;
    selectively removing said protective layer over said NMOS gate and said PMOS gate whereby said protective layer is not removed from said NMOS gate sidewall spacers, said NSD areas, said PMOS gate sidewall spacers, or said PSD areas;
    forming a layer of gate metal on top surfaces of said NMOS gate and said PMOS gate;
    heating said gate metal, said NMOS gate and said PMOS gate so as to form:
        an NMOS metal rich silicide layer in a top region of said NMOS gate;
        an intermediate NMOS silicide layer in said NMOS gate below said NMOS metal rich silicide layer;
        an NMOS metal deficient silicide region in said NMOS gate below said intermediate NMOS silicide layer;
        a PMOS metal rich silicide layer in a top region of said PMOS gate;
        an intermediate PMOS silicide layer in said PMOS gate below said PMOS metal rich silicide layer; and
        a PMOS metal deficient silicide region in said PMOS gate below said intermediate PMOS silicide layer;
    removing said protective layer from said NSD areas and said PSD areas whereby neither said NMOS metal rich silicide layer in said top region of said NMOS gate or said PMOS metal rich silicide layer in said top region of said PMOS gate are substantially removed;
    forming a layer of source/drain metal on said NSD areas and said PSD areas;
    heating said source/drain metal, said NSD areas and said PSD areas so as to form NSD silicide layers in top regions of said NSD areas and form PSD silicide layers in top regions of said PSD areas, wherein said NSD silicide layers and PSD silicide layer are formed after heating the gate metal;
    removing unreacted source/drain metal by a process further comprising wet etching, whereby neither said NMOS metal rich silicide layer in said top region of said NMOS gate or said PMOS metal rich silicide layer in said top region of said PMOS gate is substantially removed; and
    after removing unreacted source/drain metal, annealing said NMOS gate and said PMOS gate and to form an NMOS FUSI gate which has said desired FUSI stoichiometry and form a PMOS FUSI gate which has said desired FUSI stoichiometry.

14. The method of claim 13, in which said step of annealing said NMOS gate said PMOS gate also produces a desired source/drain silicide stoichiometry in said NSD silicide layers and in said PSD silicide layers.

15. The method of claim 14, in which said gate metal is selected from the group consisting of:
    nickel;
    a mixture of nickel and platinum.

16. The method of claim 15, in which said NMOS metal rich silicide layer and said PMOS metal rich silicide layer are substantially comprised of $Ni_2Si$.

17. The method of claim 16, in which said step of forming a protective layer further comprises the steps of:
    forming a layer of silicon dioxide on top surfaces of said NMOS gate, said NMOS sidewall spacers, said NSD areas, said PMOS gate, said PMOS sidewall spacers and said PSD areas; and
    forming a layer of silicon nitride on a top surface of said layer of silicon dioxide.

18. The method of claim 17, in which said source/drain metal is selected from the group consisting of:
    nickel;
    a mixture of nickel and platinum.

19. The method of claim 18, in which a thickness of said PMOS metal rich silicide layer is different than a thickness of said NMOS metal rich silicide layer.

* * * * *